(12) United States Patent
Jewett et al.

(10) Patent No.: US 6,392,210 B1
(45) Date of Patent: May 21, 2002

(54) METHODS AND APPARATUS FOR RF POWER PROCESS OPERATIONS WITH AUTOMATIC INPUT POWER CONTROL

(76) Inventors: Russell F. Jewett, 10220 Scott Gate Ct., Charlotte, NC (US) 28201; Curtis C. Camus, 2702 High Plains Ct., Fort Collins, CO (US) 80521

( * ) Notice: Subject to any disclaimer, the term of this patent is extended or adjusted under 35 U.S.C. 154(b) by 0 days.

(21) Appl. No.: 09/490,128

(22) Filed: Jan. 24, 2000

Related U.S. Application Data

(60) Provisional application No. 60/174,110, filed on Dec. 31, 1999.

(51) Int. Cl.[7] .................................................. H05B 6/06
(52) U.S. Cl. .................. 219/663; 219/664; 219/121.54; 323/299; 363/74
(58) Field of Search .................................. 219/661, 663, 219/664, 665, 666, 668, 121.57, 121.54, 137 PS, 130.5, 130.1; 156/345; 323/299, 303; 315/111.21, 17.3, 464; 204/298.08, 298.32; 363/73, 74

(56) References Cited

U.S. PATENT DOCUMENTS

| | | | |
|---|---|---|---|
| 4,147,910 A | | 4/1979 | Kiuchi et al. |
| 4,188,520 A | * | 2/1980 | Dills .......................... 219/486 |
| 4,687,896 A | | 8/1987 | Baik |
| 5,223,457 A | | 6/1993 | Mintz et al. ................. 437/225 |
| 5,272,719 A | * | 12/1993 | Cartlidge et al. ........... 219/662 |
| 5,383,019 A | | 1/1995 | Farrell et al. ................ 356/316 |
| 5,556,549 A | * | 9/1996 | Patrick et al. ............... 156/345 |
| 5,654,679 A | | 8/1997 | Mavretic et al. ............ 333/17.3 |
| 5,688,357 A | * | 11/1997 | Hanawa ....................... 156/345 |
| 5,723,970 A | * | 3/1998 | Bell ............................. 320/30 |
| 5,892,198 A | | 4/1999 | Barnes et al. ........... 219/121.54 |
| 5,991,170 A | * | 11/1999 | Nagai et al. .................... 363/20 |

* cited by examiner

*Primary Examiner*—Philip H. Leung
(74) *Attorney, Agent, or Firm*—Larry Williams

(57) ABSTRACT

A variable frequency RF power delivery system is used with a control system that adjusts the output frequency of the RF power delivery system. Frequency adjustments are made so as to maintain the required input current and input voltage within the capabilities of the input current and input voltage source.

31 Claims, 6 Drawing Sheets

METHODS AND APPARATUS FOR RF POWER PROCESS OPERATIONS WITH AUTOMATIC INPUT POWER CONTROL

CROSS-REFERENCES

The present application claims the benefit of U.S. Provisional Patent Application No. 60/174,110, filed on Dec. 31, 1999. The present application is related to U.S. patent application Ser. No. 09/476,020, filed on Dec. 31, 1999, U.S. Provisional Patent Application No. 60/174,110, entitled "Methods and Apparatus for Process Operations with RF Power" by Russell F. Jewett and Curtis C. Camus filed on Dec. 31, 1999, U.S. patent application entitled "Methods and Apparatus for Igniting and Sustaining Inductively Coupled Plasma" filed on Jan. 24, 2000 now U.S. Pat. No. 6,291,938, and U.S. patent application No. 09/490,496 entitled "Methods and Apparatus for Plasma Processing" by Russell F. Jewett, filed on Jan. 24, 2000, now U.S. Pat. No. 6,156,667. All of these applications are incorporated herein by this reference.

BACKGROUND

This invention relates to improved methods and apparatus for controlling input power requirements for delivering radio frequency (RF) power for process operations. RF power is extensively used in a wide variety of applications for carrying out process operations. Exemplary of such process operations is RF induction heating. RF induction heating involves coupling RF power to a material that absorbs the RF power and converts the RF power into heat. In other words, the currents induced in material by the RF power are converted into heat because of the electrical resistance of the material that absorbs the RF power. In this manner, the RF power can be used to heat an object without having physical contact between the power source and the object. This type of heating can be used wherein the object is the material that absorbs the RF power and is heated directly by the RF power. Alternatively, the object may be in contact with or near a second material that absorbs RF power; the second material absorbs the RF power and creates the heat; the heat is then transferred to the workpiece by conduction, convection, or radiation.

In another example of RF heating, the RF power can be coupled to a gas to produce a thermal plasma. Free electrons in the thermal plasma absorb the RF power and are raised to high energy levels. These energetic free electrons interact with other gas phase species to produce a high temperature mixture that can transfer their thermal energy to other gases, liquids, or solids.

The thermal plasmas mentioned above can be used to promote chemical reactions. Chemical reactions can be promoted because of the high temperatures of the thermal plasma. Alternatively, thermal plasmas are able to promote chemical reactions because of the ability of the energetic electrons to break chemical bonds and allow chemical reactions to occur that would proceed with difficulty under non-plasma conditions.

The manufacture of optical fiber preforms is an example of the use of thermal plasmas generated using RF power. The RF thermal plasma provides the energy for driving the chemical reactions in gas mixtures of silicon compounds, oxygen, and dopants. The chemical reactions cause deposition of doped silica layers.

Another example involving RF power thermal plasmas is the operation of high-pressure gas lasers. In gas laser operation the important characteristic of the RF plasma is the light emission that occurs because of the plasma. The thermal energy that is produced is generally not considered important to the operation of the laser.

In other applications, RF power is used to produce non-thermal plasmas, also referred to as non-equilibrium plasmas. The manufacture of semiconductor devices is one area in which non-thermal plasmas are extensively used. The non-thermal plasmas are used for etch processes wherein the non-thermal plasmas are used to generate reactive species in a gas to accelerate reactions between the species and a solid surface. The etch process can be a general removal of components on the surface as in a cleaning process or the selective removal of material from certain areas on the surface through use of a masking material that has been previously patterned. Non-thermal plasmas are used to promote deposition reactions wherein gas phase species are caused to react to form a solid product that deposits on surfaces. During the manufacture of semiconductor devices, etch processes involving RF plasmas and deposition processes involving RF plasmas are used repeatedly during the fabrication process. One of the main benefits of using the non-thermal plasma is the ability of the non-thermal plasma to stimulate chemical reactions that would otherwise require temperatures that are too high for use in the fabrication of semiconductor devices.

RF power non-thermal plasmas are also used as cleaning processes in manufacture of semiconductor devices. The non-thermal plasmas are commonly used to strip photoresist materials from semiconductor wafers as part of post etch wafer clean procedures. The photoresist material serves as a mask material during etch processes used in patterning the surface of the devices. Resist material is stripped from the surface of the wafers by creating a non-thermal plasma in a gas containing oxidizing species such as oxygen and possibly halogen species that are capable of reacting with and volatilizing the resist material. In some applications, the non-thermal plasma is maintained at a position upstream of the wafer. Reactive species generated in the non-thermal plasma flow downstream and react with the wafer surface for the stripping process.

Another cleaning process that uses non-thermal plasmas is the cleaning of reaction chambers used in manufacturing semiconductor devices. Sometimes, the reaction chambers used in plasma etch processes experience a buildup of deposits from the etch process. These deposits must be removed as part of the reactor maintenance process. Also, the reactors that are used in deposition processes for semiconductor device fabrication undergo a buildup of deposits on the reactor walls; the wall deposit must be removed as part of reactor maintenance. Non-thermal plasmas generated using RF power and gases containing species that are reactive with the deposits have been used to volatilize and remove the deposits built up on the walls of etch reactors and deposition reactors.

RF power plasmas have also been used for decomposition of chemical compounds that are hazardous or otherwise undesirable. Some of the compounds are highly refractory in nature and are difficult to decompose. Examples of compounds that have been decomposed or abated with plasmas include chlorofluorocarbons (CFC) and perfluorocompounds (PFC).

The applications given above where RF power is used as part of a process makeup only a small fraction of the applications for RF power. There are numerous additional processing applications for RF power. However, the methods and apparatus typically used to deliver RF power have deficiencies and may be inefficient for use in existing applications. Some of the deficiencies are common for multiple applications. The existing deficiencies in the prior methods and apparatus for RF power delivery may limit the use of RF power for possible new applications.

One frequently encountered problem with standard RF power delivery systems is that the equipment is typically designed for use at only one set of optimized input power conditions. Specifically, the required input current and input voltage only have a small range of values for operation of the RF power delivery system. The narrow operating conditions for input power in terms of current and voltage presents a problem for the typical AC power source lines available in homes, offices, and factories around the world. To accommodate the input power requirements for standard RF power delivery systems, three phase AC power sources are typically required to assure having adequate current and voltage for the power input to the RF power delivery system. Providing three phase AC power sources may require additional wiring if the three phase AC lines are not already available. Consequently, the use of some RF power delivery systems can be hindered by the unavailability of three phase AC electric power. Furthermore, the variation in the standard current and voltage for AC power lines used in different countries can also hinder the use of RF power delivery systems. To overcome these problems, the old-style RF power delivery systems have been required to have special power converters to accommodate the current and voltage sources available in each country.

Based on the variety of possible applications for RF power delivery as described above, there are numerous situations in which it would be advantageous to have an RF power delivery system capable of operating over a wide range of input current and voltage. There is a need for improved RF power delivery methods and apparatus that require a minimum or no special wiring to access the electric power source. In addition, there is a need for RF power delivery systems that can be plugged into any standard AC power lines that are used in offices and factories all over the world. There is a need for RF power delivery methods and apparatus that are simple in operation and have the versatility to handle a wide range of input electric power currents and voltages.

SUMMARY

This invention is related to methods and apparatus that can overcome deficiencies of known RF power delivery systems. Practicing this invention makes it possible to achieve RF power delivery to a load for which the required input currents and voltages are controlled to stay with in the capabilities of currents and voltages for the available electric power source.

The electric power characteristics are also referred to as power form. Specifically, the electric power characteristics are the combination of current and voltage that makeup the electric power. A given quantity of electric power can be provided as various combinations of current and voltage. For example, 1000 watts of electric power can have an approximate power form of 10 amps at 100 volts, 20 amps at 50 volts, or 5 amps at 200 volts.

Variable frequency RF power amplifiers are capable of providing an output RF power for which the frequency of the RF power can have values within the frequency range of the RF power amplifier. Usually, the frequencies or rather the ranges of frequencies are varied as part of delivering the RF power to a load for a process operation. For a specified magnitude of RF power and a specified frequency of the RF power, the RF power amplifier requires an input of electric power having a particular current and voltage combination i.e. power form. In other words, the RF power amplifier has specific requirements of input current and voltage in order to provide the specified frequency of the RF power. Consequently, it is possible to adjust the frequency of the RF power and maintain the desired magnitude of the RF power so that the required power form of the input power is varied. This particular behavior of the RF power amplifier can be used with a controller responsive to the input power requirements to automatically adjust the frequency of the output RF power so as to maintain the required power form of the input electric power within the capabilities of the input electric power source.

The frequency is controlled automatically in order to achieve an input requirement of current and voltage that meets the capabilities of the available power source. Further adjustments are made in order to achieve desired, preferably efficient, RF power delivery to the load. The further adjustments may include changes in the impedance that the RF power amplifier sees in delivering RF power to the load or changes in the frequency of the RF power to obtain a frequency that is resonant with coupling RF power to the load.

Aspects of the present invention are accomplished using a power form controller and a variable frequency RF power delivery system. The power form controller is responsive to power characteristics of input power to the RF power delivery system. The controller provides signals to the RF power delivery system to adjust the frequency of the output power from the RF power delivery system so that the required power form for the input power to the RF power delivery system does not exceed the capabilities of the input electric power source.

In different embodiments of the present invention, the variable frequency RF power delivery systems may be of different designs and may use different methods of operation. Examples of variable frequency RF power delivery systems are described in 1999 U.S. Pat. No. 5,892,198 to Barnes et al., 1997 U.S. Pat. No. 5,654,679 to Mavretic et al., 1995 U.S. Pat. No. 5,383,019 to Farrell et al., and 1993 U.S. Pat. No. 5,223,457 to Mintz et al.; all of these applications are incorporated herein by this reference.

Standard variable frequency RF power delivery systems typically include a variable frequency RF power amplifier, a match network, an RF power coupling element, one or more sensors, and one or more controllers. The sensor can include one or more pickups for deriving information about the RF power. The RF power amplifier provides an output RF power through the match network to the RF power coupling element. The sensor collects information about the RF power and provides the information to the controller. The controller responds to information input from the sensor to provide control signals to the RF amplifier to specify the magnitude and frequency of the RF power output. The controller or another controller may provide signals to control impedance matching if the match is a variable match network.

Standard variable frequency RF power delivery systems can be included in embodiments of the present invention. A requirement for using standard variable frequency RF power delivery systems in embodiments of the present invention is that the RF power delivery systems must be capable of being modified to implement power form control. The power form control capability adjusts the base frequency of operation or rather the frequency range of operation in response to characteristics of input electric power for RF power amplifiers in the RF power delivery systems.

Alternatively, variable frequency RF power delivery systems that are more advanced than those commonly known may also be used in embodiments of the present invention. For example, 1999 United States patent application titled "Methods and Apparatus for RF Power Delivery" by Russell F. Jewett and Curtis C. Camus filed on Dec. 31, 1999, incorporated herein by reference, describes an advanced variable frequency RF power delivery system suitable for use in embodiments of the present invention.

An aspect of the present invention is a method of operating a variable frequency RF power delivery system for delivering RF power to a load for a process operation. The method is carried out using a variable frequency RF power source. The variable frequency RF power source includes an RF power amplifier, one or more sensors, and an RF power coupling element disposed so as to couple RF power to the load. The method includes adjusting at least one of:

a) frequency of the delivered RF power; and b) impedance seen by the RF power source; in response to measurements of RF power delivery efficiency so as to achieve desired, preferably efficient, delivery of the RF power to the load and also automatically adjusting the frequency of the delivered RF power in response to a parameter representative of the current and voltage of the electric power input to the RF power amplifier so as to maintain the input current and voltage within the limits of the available power source.

One embodiment of the present invention is a method of operating a variable frequency RF power delivery system for delivering RF power to a load for a process operation. The method is carried out using a variable frequency RF power source. The variable frequency RF power source includes an RF power amplifier, one or more sensors, and an RF power coupling element disposed so as to couple RF power to the load. The method includes adjusting the frequency of the delivered RF power in response to a parameter representative of the RF power delivery efficiency so as to achieve efficient delivery of the RF power to the load. The method further includes adjusting the frequency of the delivered RF power automatically in response to a parameter representative of the current and voltage of the electric power input to the RF power amplifier so as to maintain the input current and voltage within the limits of the available electric power source.

Another aspect of the present invention is an apparatus for RF power delivery including a variable frequency RF power source and a control system. The control system is capable of adjusting at least one of:

a) frequency of the delivered RF power; and b) impedance seen by the RF power source; in response to the RF power delivery efficiency so as to achieve desired, preferably efficient, delivery of the RF power to the load. The control system is also capable of adjusting the frequency of the delivered RF power in response to a parameter representative of the current and voltage of the electric power input to the RF power amplifier so as to maintain the input current and voltage within the limits of the available electric power source.

Another aspect of the present invention is an apparatus for RF power delivery including a variable frequency RF power source and a control system. The control system is capable of adjusting the frequency of the delivered RF power in response to a parameter representative of the RF power delivery efficiency so as to achieve desired, preferably efficient, delivery of the RF power to the load and also adjusting the frequency of the delivered RF power in response to a parameter representative of the input power current and voltage of the electric power input to the RF power amplifier so as to maintain the input current and voltage within the limits of the available electric power source.

Suitable control systems for practicing embodiments of the present invention can include one or more controllers for each of the parameters being controlled. Alternatively, suitable control systems may include a single controller that is capable of controlling multiple parameters simultaneously.

In one embodiment, a control system, capable of controlling two or more parameters simultaneously, is used to achieve desired, preferably efficient, RF power delivery to a load. In addition, the control system is used to automatically control the frequency of the delivered RF power in order to achieve efficient use of the available input electric power characteristics.

In another embodiment, the control system is capable of controlling two or more parameters simultaneously. The control system is used to control the frequency in order to achieve desired, preferably efficient, RF power delivery to the load. In addition, the control system is used to control the frequency in order to achieve efficient use of the available input electric power characteristics.

The power form of the input electric power is directly represented by measurements of the current and voltage of the input power. Similarly, the power form of the electric power source is directly represented by the current and voltage available from the electric power source. One embodiment of the present invention includes measuring the current and voltage to obtain the power form of the input electric power. Alternative embodiments of the present invention can use alternative indicators of the input power form. Examples of parameters that are representative of the input power form include input electric power current, input electric power voltage, RF power current, and RF power voltage. Examples of suitable embodiments for controlling the power form of the input electric power through adjustments in the RF power frequency include:

a) minimizing RF voltage by adjusting the RF frequency;

b) minimizing input electric power voltage by adjusting the RF frequency;

c) maximizing input electric power current by adjusting the RF frequency; and d) maximizing RF current by adjusting the RF frequency. In preferred embodiments the RF voltage and RF current are measured at the RF power coupling element.

Numerous control techniques can be used for adjusting the frequency to control the input power form in embodiments of the present invention. Examples of control techniques that can be used include incrementing and decrementing in fixed amounts, proportional, integral, and derivative techniques and combinations thereof.

According to various aspects of the present invention, embodiments of the RF power coupling element can have any form suitable for RF power delivery. Exemplary forms of RF power coupling elements are antennas, coils, cylindrical coils, planar coils, electrodes, rings, parallel plates, screens, and waveguides. Various types of RF power coupling elements are well known in the art.

In various separate embodiments of the present invention, the load that receives the RF power may use the RF power for different applications. Exemplary functions of the loads for various applications are as follows. The load may absorb the RF power to produce heat for a heating process as in RF induction heating. The load may absorb the RF power to produce a thermal plasma such as those used for chemical processing, materials processing, analytical chemistry, or driving optical devices. The load may absorb the RF power to produce a non-thermal plasma such as those used for chemical processing or materials processing. The load may absorb RF power to produce non-thermal plasmas such as plasmas used for semiconductor device fabrication processes like etching, deposition, cleaning, doping, oxidation, drying, photoresist stripping, parts cleaning, reaction chamber cleaning, and annealing. The load may absorb RF power to produce a plasma for stimulating chemical reactions that cannot proceed or proceed slowly under non-plasma conditions. The load may absorb RF power to produce a plasma for decomposing chemical compounds. The load may absorb RF power to produce a plasma for synthesizing chemical compounds.

In another aspect of the present invention, the delivered RF power is used for abatement of gaseous halogenated organic compounds, other refractory organic compounds, perfluorocompounds, and refractory inorganic compounds. The apparatus uses a non-thermal plasma, generated by RF power, for generating free radicals in a dielectric reaction vessel. In a further aspect of the present invention, the treatment of gases is enhanced by the addition of suitable ancillary reaction gases including water, methane, hydrogen, ammonia, hydrogen peroxide, oxygen, or mixtures thereof.

Embodiments of the present invention provide methods and apparatus for RF power delivery that automatically optimize the frequency of the delivered RF power so as to enable use of a wide variety of available power characteristics for the input power.

Embodiments of the present invention provide methods and apparatus for RF power delivery such that the apparatus has a greater probability of being able to operate with a single phase AC power source in substantially any country in the world.

Embodiments of the present invention provide methods and apparatus for RF power delivery such that the apparatus automatic attempts to optimize use of the available input power source.

Embodiments of the present invention provide methods and apparatus for RF power delivery for heating as in RF induction heating.

Embodiments of the present invention provide methods and apparatus for RF power delivery for generating plasmas.

Embodiments of the present invention provide methods and apparatus for RF power delivery for generating thermal plasmas.

Embodiments of the present invention provide methods and apparatus for RF power delivery for generating non-thermal plasmas.

Embodiments of the present invention provide methods and apparatus for RF power delivery for promoting chemical reactions.

Embodiments of the present invention provide methods and apparatus for RF power delivery for generating plasmas for semiconductor device fabrication steps such as etching, deposition, cleaning, doping, oxidation, drying, photoresist stripping, parts cleaning, reaction chamber cleaning, and annealing.

Embodiments of the present invention provide methods and apparatus for removal of refractory compounds from waste streams. Refractory compounds include compounds that show a high degree of stability with respect to temperature and reactivity and are difficult to decompose.

Embodiments of the present invention provide new and useful methods and apparatus for the destruction of refractory compounds such as perfluorocompounds, such as carbon fluorides, carbon tetrafluoride, nitrogen triflouride, and sulfur hexafluoride by reactions facilitated by a plasma.

Embodiments of the present invention provide methods and apparatus for gas waste treatment using a non-thermal plasma generated by RF power.

Embodiments of the present invention provide methods and apparatus that are suitable for processing waste streams emanating from an individual semiconductor process tool and that can become an integral part of the semiconductor device fabrication process.

An advantage of embodiments of the present invention is the ability to provide an economical apparatus and method for the destruction of refractory compounds contained in gaseous waste streams.

Another advantage of embodiments of the present invention is the ability to provide waste treatment of undiluted off gases from individual semiconductor device fabrication tools. Embodiments of the present invention can be made compact enough to be integrated into and attached directly to one or more than one wafer processing tools.

The above and still further features and advantages of the present invention will become apparent upon consideration of the following detailed descriptions of specific embodiments thereof, especially when taken in conjunction with the accompanying drawings.

DESCRIPTION

Figure 1:
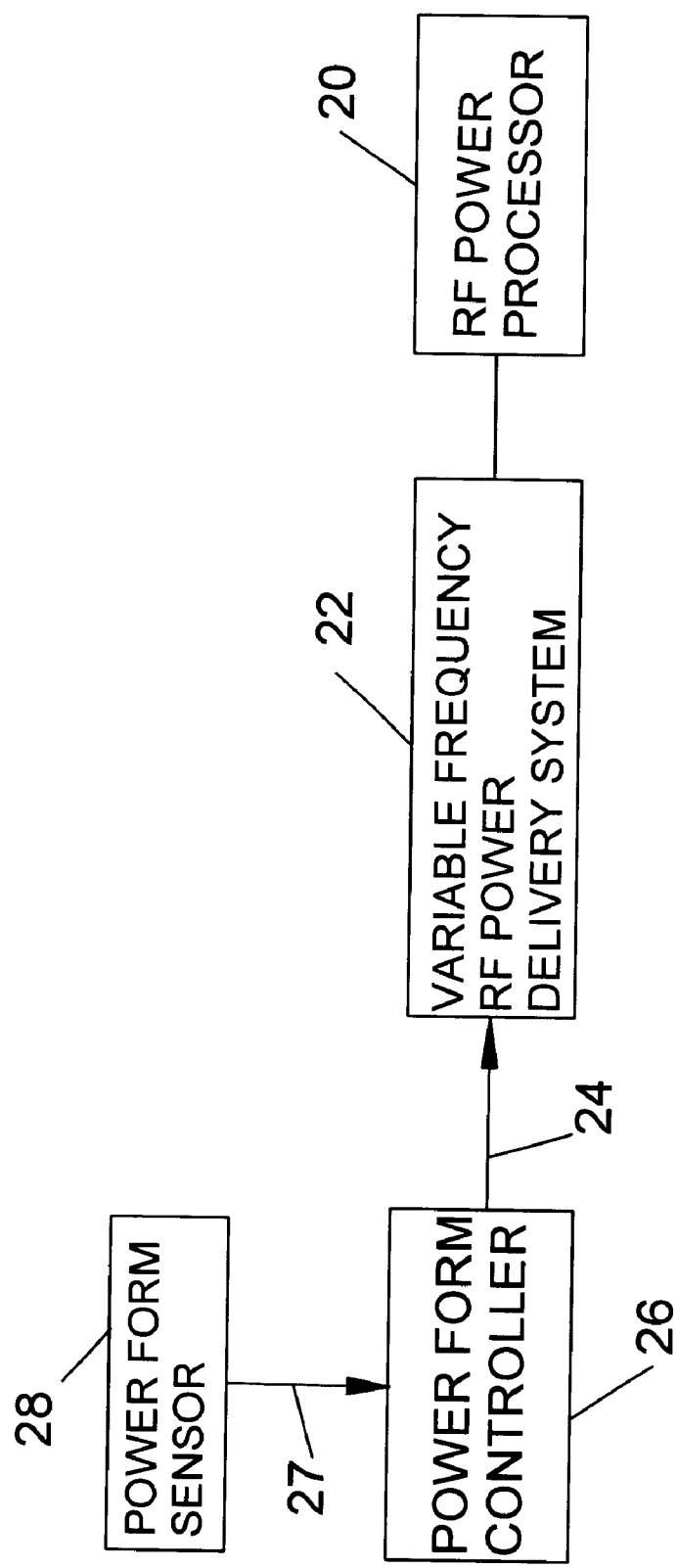
FIG. 1 is a schematic block diagram of a first embodiment of the present invention.

Reference is now made to FIG. 1 wherein there is illustrated an RF power processor 20 such as a plasma chamber, a vacuum processing plasma chamber, a plasma reactor, or an RF induction heater. The RF power processor 20 typically operates with a load capable of absorbing RF power and using the RF power for a process operation. Typical RF power operations and the characteristics of appropriate loads are well known in the art. A variable frequency RF power delivery system 22 is arranged so as to deliver RF power to the RF power processor 20. The RF power delivery system 22 is capable of receiving an input of electric power from an electric power source. Typically, the electric power source is either DC or slow AC electric power. The power source is capable of providing electric power for at least one current and voltage combination and may be capable of providing electric power over a range of combinations of voltage and current. The combination of voltage and current is defined as a power form. Power form controller 26 is capable of generating a frequency adjustment signal 24 that is provided to the RF power delivery system 22. The power form controller 26 is responsive to a power form signal 27. A power form sensor 28 is disposed so as to derive information about the power form for the input electric power to the RF power delivery system 22. The power form sensor 28 provides the power form signal 27 to the power form controller 26. The RF power delivery system 22 is capable of receiving the frequency adjustment signal 24 and changing the frequency of the output RF power to achieve the power form control for the input electric power as determined by the power form controller 26.

The power form sensor 28 can be any type of sensor capable of deriving information about power form for the input electric power to the RF power delivery system. Specifically, the power form sensor 28 derives information related to input power current, voltage, or both current and voltage. The power form sensor 28 may be connected with the RF power delivery system so as to derive the power form information for the input electric power as it enters the RF power delivery system 22. Alternatively, the power form sensor 28 may be disposed to derive power form information from measurements taken on the output RF power.

Various control procedures can be used by the power form controller 26. One embodiment includes having the power form controller 26 responsive to measurements of the input power current, voltage, or both current and voltage. In addition, the power form controller 26 can be responsive to measurements of the output RF power that are indicators of the input power form. Examples of additional methods that can be used by the power form controller 26 for controlling the power form of the input electric power include:

a) minimizing RF voltage by adjusting the RF frequency;

b) minimizing input electric power voltage by adjusting the RF frequency;

c) maximizing input electric power current by adjusting the RF frequency; and d) maximizing RF current by adjusting the RF frequency. In preferred embodiments the RF voltage and RF current are measured at the RF power coupling element.

The power form controller 26 can use numerous control techniques for adjusting the frequency to control the input power form. Examples of control techniques that can be used by the power form controller 26 include incrementing and decrementing in fixed amounts, proportional, integral, and derivative techniques and combinations thereof.

In addition to being responsive to the frequency adjustment signal 24 from the power form controller 26, the RF power delivery system 22 also includes the necessary hardware and controls required to deliver RF power to the RF power processor 20.

Figure 2:
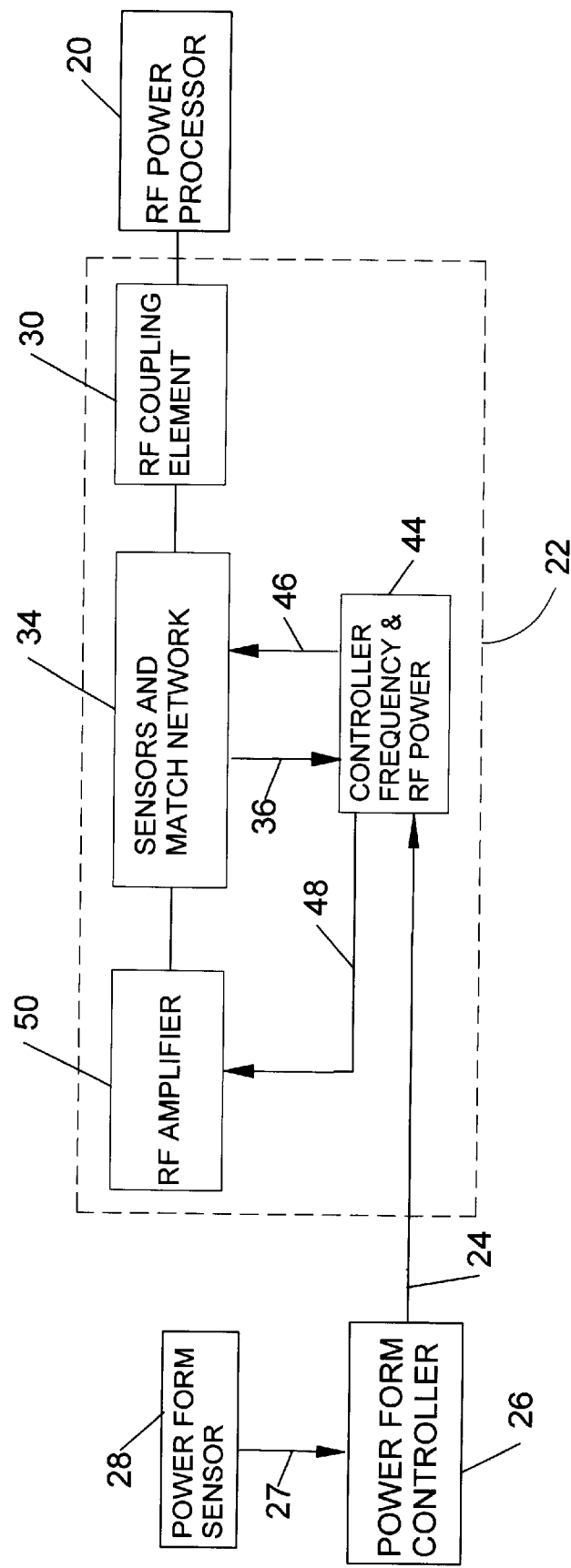
FIG. 2 is a schematic block diagram of a second embodiment of the present invention.

Reference is now made to FIG. 2 wherein there is illustrated an embodiment of the present invention showing generic details of the variable frequency RF power delivery system 22. The variable frequency RF power delivery system 22 includes an RF power coupling element 30, sensors and match network 34, an RF power amplifier 50, and RF power and frequency controller 44. The controller 44 is responsive to information signal 36 from the sensors and match network 34 the controller 44 provides control signal 46 to the sensors and match network 34 when the sensors and match network 34 include a variable RF match for controlling the impedance seen by the RF power amplifier 50. The controller 44 also provides control signal 48 to the RF power amplifier 50. The control signal 48 contains information for adjusting the RF power output, such as RF power magnitude, for the RF power amplifier 50. The control signal 48 also contains information for adjusting the frequency of the RF power output from the RF power amplifier 50.

RF power output from the RF power amplifier 50 is applied to the RF power coupling element 30 via the sensors and match network 34. The RF power coupling element 30 is disposed so as to allow coupling of the RF power to the RF power processor 20. The sensors and match network 34 and controller 44 cooperate with the RF power amplifier to achieve controlled, preferably efficient, delivery of the RF power to the RF power processor 20. The controlled delivery of RF power to the RF power processor 20 can be achieved by having the controller 44 adjust the frequency of the power output from the RF amplifier 50 so that the frequency of the delivered RF power is at a resonant frequency that allows efficient RF power delivery. Alternatively, if the sensors and match network 34 include a variable RF match network then the controlled delivery of RF power to the RF power processor 20 can be achieved by having the controller 44 adjust the variable RF match network so that the impedance for the RF amplifier 50 and the RF power processor 20 are matched to allow efficient RF power delivery.

Typically, the sensors and match network 34 monitor parameters of the output RF power such as forward RF power, reflected RF power, and phase angle between the RF current and the RF voltage that makeup the RF power. Efficient RF power delivery is usually recognized as minimum reflected RF power, maximum forward RF power, minimum standing wave ratio, or zero phase angle between the RF current and the RF voltage. Consequently, the typical indicators of RF power delivery efficiency are measurements of forward RF power, reflected RF power, standing wave ratio, and phase angles between the RF current and RF voltage.

The sensors and match network 34 are shown in a single box in FIG. 2; the single box is used merely to show the relative location of the sensors and match network with respect to other items in the RF power delivery system. Showing the sensors and match network in a single box is not to be construed as a limitation for embodiments of the present invention. Frequently, the sensors and match network are separated in actual practice.

The controller 44 is arranged to receive the frequency adjustment signal 24 from the power form controller 26. The frequency adjustment signal 24 is used by the controller 44 to adjust the frequency of the output RF power to achieve the power form control for the input electric power as determined by the power form controller 26. The functions of the power form controller 26 and the power form sensor 28 are essentially the same as was described for FIG. 1.

Figure 3:
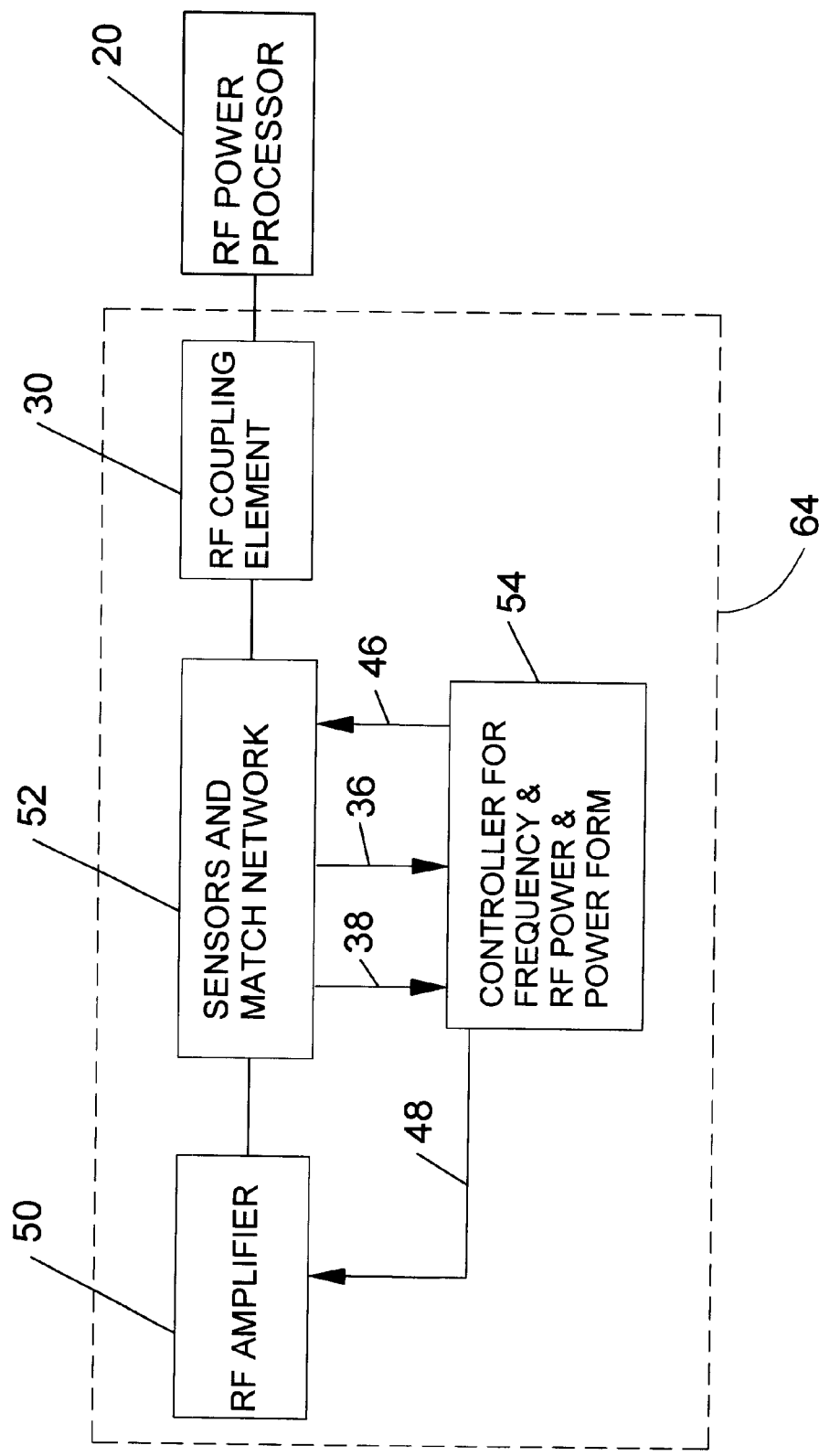
FIG. 3 is a schematic block diagram of a third embodiment of the present invention.

Reference is now made to FIG. 3 wherein there is illustrated a variable frequency RF power delivery system 64 that uses a single controller 54 for controlling the efficiency of the RF power delivery and for controlling the power form for the input electric power. The controller 54 is capable of controlling multiple parameters simultaneously. A suitable type of controller for the controller 54 is a microprocessor based controller with associated memory, such as a computer. In addition, sensors and match network 52 also includes capabilities for deriving power form information for the input electric power; the power form information is used to derive a power form signal 38 that is applied to the controller 54 for controlling the power form of the input electric power for the RF amplifier 50. The controller 54 also receives information signal 36 and sends control signals 46 and 48 to achieve efficient delivery of RF power to the RF power processor 20.

The sensors and match network 52 is shown in a single box in FIG. 3; the single box is used merely to show the relative location of the sensors and match network with respect to other items in the RF power delivery system 64. Showing the sensors and match network in a single box is not to be construed as a limitation for embodiments of the present invention. Frequently, the sensors and match network are separated in actual practice.

Figure 4:
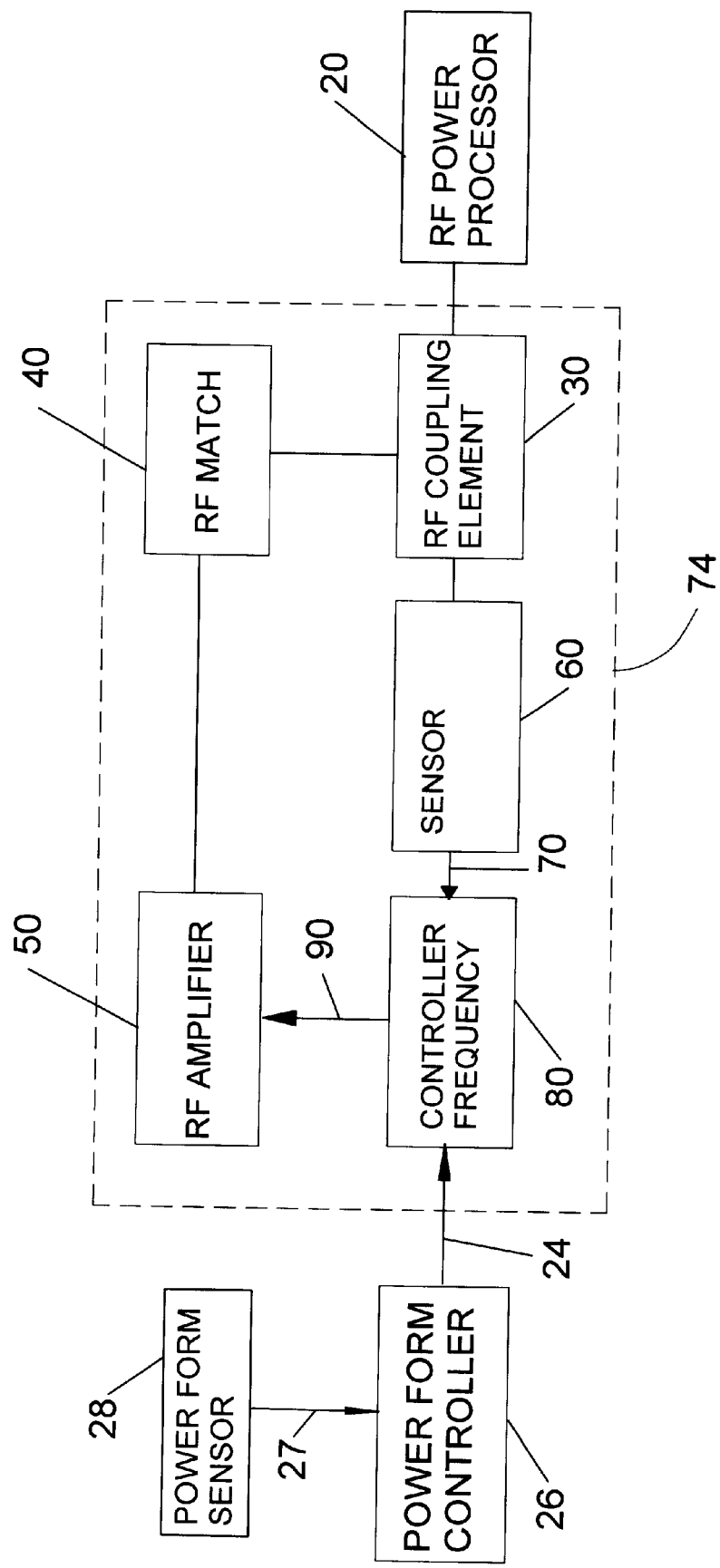
FIG. 4 is a schematic block diagram of a fourth embodiment of the present invention.

Reference is now made to FIG. 4 wherein there is illustrated a variable frequency RF power delivery system 74 that uses principles of operation that differ from those of standard variable frequency RF power delivery systems. The RF power coupling element 30 is positioned so as to inductively couple RF power to the RF power processor 20. An RF match 40 is connected with the RF power coupling element 30. The variable frequency RF power amplifier 50 is connected with the RF match 40 so that RF power output from the variable frequency RF power amplifier 50 can be applied to the RF power coupling element 30 via the RF match 40. The variable frequency RF power amplifier 50 is a standard RF power amplifier that uses a reference RF signal and input electric power so that it is capable of providing a relatively high output RF power. Examples of two types of reference RF signals are RF current and RF voltage.

A sensor 60 is located near the RF power coupling element 30. The sensor 60 is arranged so as to be capable of deriving information for one or more of the oscillating characteristics of RF power in the RF power coupling element 30. The sensor 60 includes one or more pickups for deriving information. An example of the information derived by the sensor 60 includes phase information; another example is frequency information. The sensor 60 is also capable of providing an output signal 70 related to the information representative of the characteristics of RF power in the RF power coupling element 30.

A controller 80 receives the output signal 70 from the sensor 60. The controller 80 maintains a constant phase angle between the output signal 70 and the reference RF signal used by the RF power amplifier 50. The controller 80 maintains the constant phase angle by adjusting the frequency of the reference RF signal used by the RF power amplifier 50. The controller 80 provides the reference RF signal information as an output signal 90 to the RF power amplifier 50. The RF power amplifier 50 uses the output signal 90 and electric power input to produce the RF power applied to the RF match 40.

Preferably, the constant phase angle used by the controller 80 is a predetermined constant incorporated in the controller 80 as a control parameter. Various commercially available controllers can be used for the controller 80. Typical controllers that can be selected for the controller 80 use a phase locked loop. A phase locked loop is a control arrangement that uses feedback to maintain an output signal in a specific phase relationship with a signal supplied to the phase locked loop. When a phase locked loop is selected to provide the control for the controller 80, the phase locked loop maintains a constant phase angle between the reference RF signal used by the RF power amplifier 50 and the output signal 70.

Techniques for incorporating the constant phase angle into the controller 80 are well known to those skilled in the art. It is typical for controllers suitable for use as the controller 80 to allow setting the control parameters such as phase angles. The constant phase angle is derived and incorporated as part of pre-tuning the controller. An example procedure for pre-tuning the controller includes: using the controller to control RF power delivery to a representative load such as a load similar to the load that the controller will be expected to handle; monitoring a parameter of the RF power delivery indicative of the RF power delivery efficiency; varying the control parameters of the controller, such as the phase angle, so as to tune the RF power delivery to achieve desired, preferably optimum, power delivery conditions; fixing the control parameter settings for the controller so that in subsequent use the controller is capable of controlling using the predetermined control parameters such as the predetermined phase angle. In other words, the controller is set with the predetermined control parameters including the predetermined constant phase angle.

Consequently, the RF power delivery system 74 shown in FIG. 4 is capable of maintaining the predetermined constant phase angle between the reference RF signal used by the RF power amplifier 50 and the characteristic of the RF power in the RF power coupling element 30 so as to effect desired, preferably efficient, RF power delivery to the RF power processor 20.

The controller 80 is also arranged to receive the frequency adjustment signal 24 from the power form controller 26. The frequency adjustment signal 24 is used by the controller 80 to adjust the frequency of the output RF power to achieve the power form control for the input electric power as determined by the power form controller 26. The functions of the power form controller 26 and the power sensor 28 are essentially the same as was described for FIG. 1.

Figure 5:
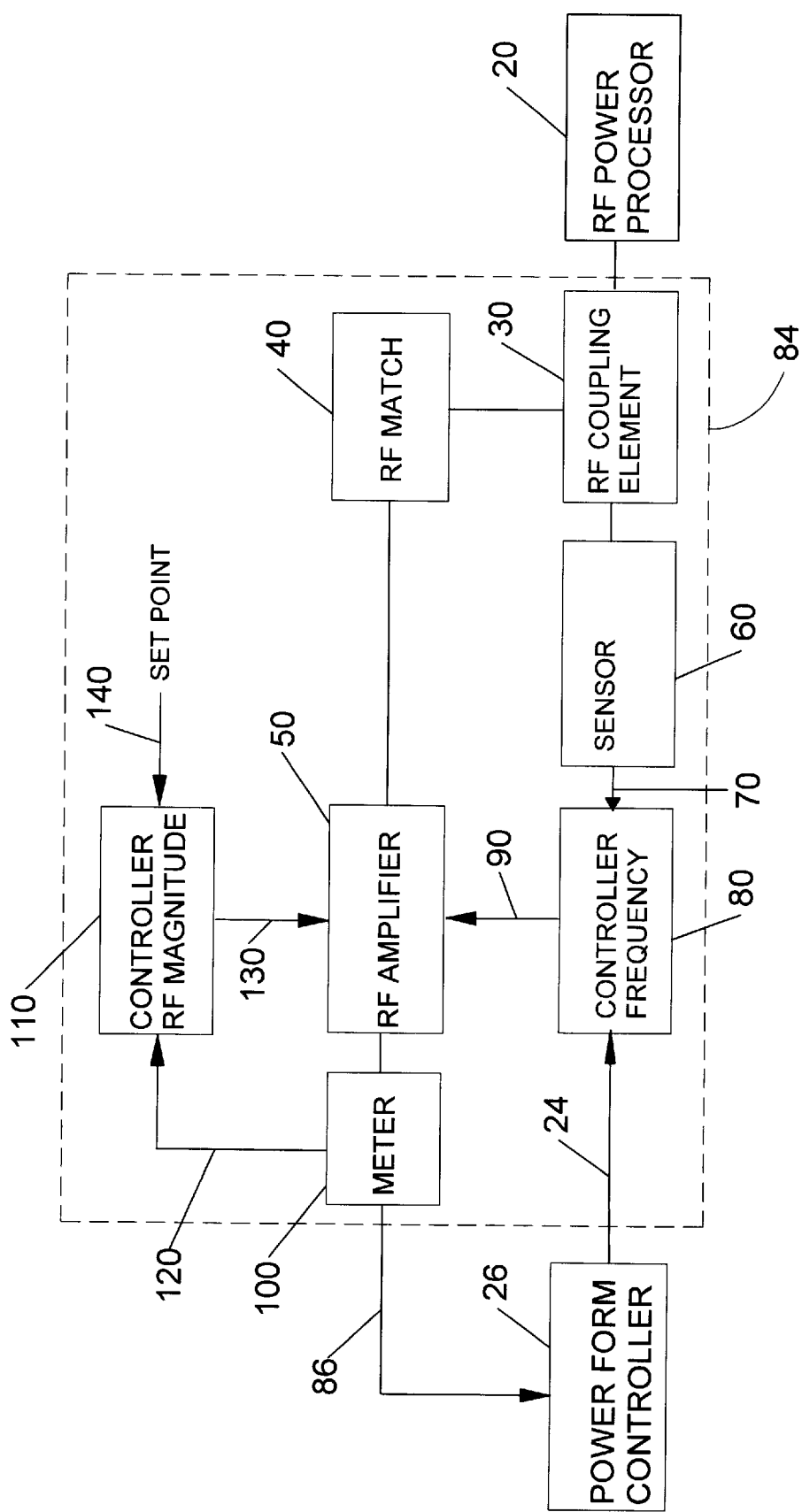
FIG. 5 is a schematic block diagram of a fifth embodiment of the present invention.

Reference is now made to FIG. 5 wherein there is illustrated a variable frequency RF power delivery system 84 that uses principles of operation like those for the embodiment in FIG. 4 and also has improved RF power magnitude control. The RF power coupling element 30 is disposed so as to inductively couple RF power to the RF power processor 20. An RF match 40 is connected with the RF power coupling element 30. The RF match 40, RF power amplifier 50, sensor 60, and controller 80 all function as described for FIG. 4. However, differing from FIG. 4, FIG. 5 shows a meter 100 coupled with the RF power amplifier 50 to enable the meter 100 to make measurements on the input electric power provided to the RF power amplifier 50. The meter is capable of measuring one or more characteristics of the electric power provided to the RF power amplifier 50. Examples of the characteristics of the electric power that the meter 100 may be capable of measuring include input power magnitude, input power voltage, and input power current. The meter 100 produces a control signal 120 containing information from the power measurements by the meter 100. A controller 110 is used to control the magnitude of a characteristic of the RF power delivered to the load. The power meter 100 provides to the second controller 110 the control signal 120 containing information from the power measurements by the meter 100. The controller 110 also receives set point information 140 for the desired magnitude of the characteristics for the RF power. The controller 110 derives an output signal as a gain signal 130 for controlling magnitude of the RF power delivered to the load. The gain signal 130 is based on the set point information 140 and the control signal 120. The gain signal 130 from the controller 110 is input to the RF power amplifier 50 for adjusting the gain of the RF power amplifier 50. The controller 110 adjusts the gain of the RF power amplifier 50 to maintain the power input to the RF power amplifier 50 at a value that substantially equals the power specified by the set point information 140. Controlling the input power to the RF power amplifier 50 to the set point information 140 for the controller 110 provides control of the magnitude of the RF power delivered to the RF power processor 20 to a predetermined magnitude.

The magnitude of the RF power can be derived from measurements of the input power to the RF power amplifier 50 by the meter 100 and the known conversion efficiency of the RF power amplifier 50. The conversion efficiency for the RF amplifier can be measured experimentally as in performing a calibration. Deriving the RF power magnitude from measurements of the input DC or slow AC power and the RF amplifier conversion efficiency eliminates the need for measuring the RF power output from the amplifier 50. In other words, there is no need to measure the relatively high RF power.

Consequently, the variable frequency RF power delivery system 84 shown in FIG. 5 is capable of maintaining the predetermined constant phase angle between the reference RF signal used by the RF power amplifier 50 and the characteristic of the RF power in the RF power coupling element 30 so as to effect desired, preferably efficient, RF power delivery to the load at the controlled magnitude of the characteristic of the RF power determined by the set point. Examples of characteristics of the RF power for which the magnitude can be controlled in performing the RF power delivery include magnitude of the RF power, magnitude of the RF current, and magnitude of the RF voltage.

The controller 80 is also arranged to receive the frequency adjustment signal 24 from the power form controller 26. The frequency adjustment signal 24 is used by the controller 80 to adjust the frequency of the output RF power to achieve the power form control for the input electric power as determined by the power form controller 26. The meter 100 derives information about the input electric power; the information obtained by the meter 100 can be used to derive power form information for controlling the power form of the input electric power. The meter 100 is also capable of providing a power form signal 86 to the power form controller 26. The power form controller 26 uses the power form signal 86 to control the power form for the input electric power as was described for FIG. 1.

Figure 6:
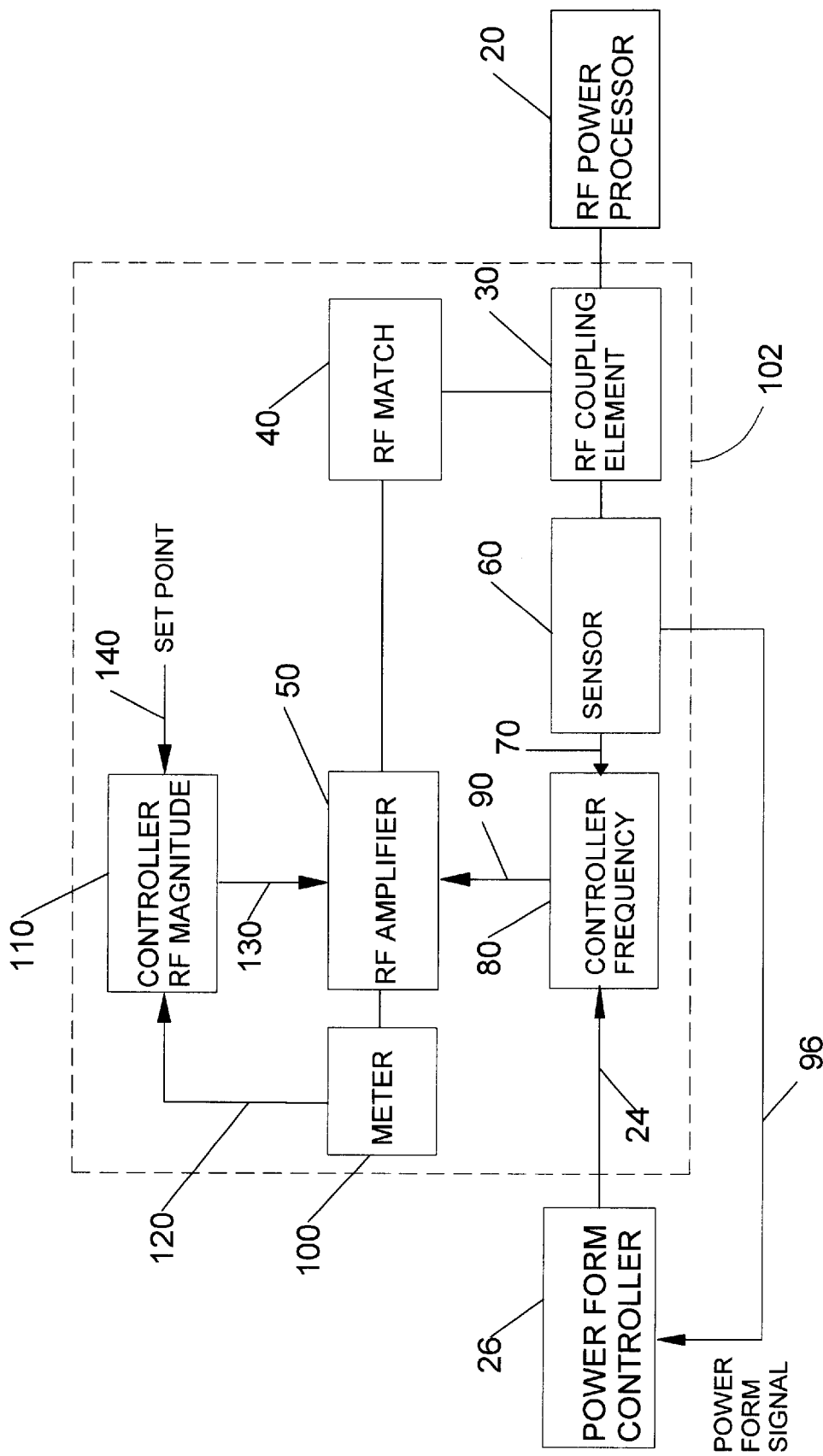
FIG. 6 is a schematic block diagram of a sixth embodiment of the present invention.

Reference is now made to FIG. 6 wherein there is illustrated a variable frequency RF power delivery system 102 that uses principles of operation like those for FIG. 5. The embodiment shown in FIG. 6 differs from that shown in FIG. 5 in that the sensor 60 is also used to derive the power form information and provides power form signal 96 to the power form controller 26 for controlling the power form of the input electric power. In addition, the embodiment shown in FIG. 6 does not require the meter 100 to be capable of providing the power form signal. The sensor 60 includes at least one pickup for determining characteristics of the RF power in the RF power coupling element. Two examples of the types of pickup that can be used are current pickups and voltage pickups.

The embodiments of the present invention shown in FIG. 4, FIG. 5, and FIG. 6 use two or more controllers. However, it is not necessary to use multiple controllers. Embodiments of the present invention may include a control system capable of controlling multiple parameters simultaneously. The control system may include multiple separate controllers or a single controller capable of controlling multiple parameters simultaneously. For example, a control system that includes a microprocessor and associated memory, such as a computer control system, can be configured with multiple data inputs and data outputs for sending and receiving information in order to control multiple parameters simultaneously.

Embodiments of the present invention can be used in a wide variety of RF power delivery applications. The type of application for the embodiments of the present invention determines the required apparatus for the RF power processor 20. For example, using the present invention embodiments for low-pressure plasma processing such as non-thermal plasma processing requires delivery of RF power to the RF power processor 20 wherein the RF power processor 20 includes a plasma chamber. The plasma chamber must be capable of containing a gas at suitable pressure for generating the plasma. Plasma chambers of this type are well known in the art. Low-pressure plasma processing chambers, such as vacuum plasma processing chambers, are extensively used in applications such as plasma processes for electronic device fabrication.

Embodiments of the present invention are particularly suited for plasma processing wherein the RF power is coupled to an ionizable gas to produce a plasma for stimulating chemical reactions. Exemplary reactions include reactions for synthesizing chemical products, reactions for decomposing chemical compounds, and reactions for surface treatment. For this type of application, the RF power processor 20 includes a plasma chamber with means for receiving and removing the gas, such as gas inlets and gas exits.

Embodiments of the present invention can be used to carry out plasma processing for which the plasma processing includes plasma treatment of a workpiece. Example workpieces include substrates such as semiconductor wafers that are subjected to plasma processes used in the fabrication of electronic devices and substrates subjected to plasma processes for fabrication of optical elements and devices. For applications of this type, the RF power processor 20 also includes methods and apparatus for positioning the workpieces during plasma processing. The RF power processor 20 further includes means for receiving and removing ionizable gas suitable for plasma processing.

Alternatively, embodiments of the present invention can be applied to plasmas operating at pressures other than low pressure, like at atmospheric pressure. Plasmas operating at atmospheric pressure, optionally, may be open to the atmosphere. An embodiment of the present invention is to generate a plasma open to the atmosphere without significant confinement of the plasma except the confinement determined by the RF power coupling element. This type of plasma may also be referred to as a plasma torch.

While there have been described and illustrated specific embodiments of the invention, it will be clear that variations in the details of the embodiments specifically illustrated and described may be made without departing from the true spirit and scope of the invention as defined in the appended claims and their legal equivalents.

What is claimed is:

1. An apparatus for receiving input electric power from an electric power source and delivering RF power to an RF power processor, the apparatus comprising:

means for delivering RF power to the RF power processor; and means for adjusting the frequency of the RF power so as to maintain the input current and input voltage within the capabilities of the electric power source.

2. The apparatus of claim 1 wherein the means for delivering RF power to the RF power processor comprises:

an RF power coupling element, the RF power coupling element being capable of and disposed so as to couple RF power to the RF power processor;

an RF match connected with the RF power coupling element;

a variable frequency RF power amplifier connected with the RF match, the RF power amplifier being capable of receiving electric power from the electric power source, the RF power amplifier being capable of applying RF power to the RF match;

a sensor, the sensor being capable of deriving RF power delivery efficiency, the sensor being disposed so as to derive RF power delivery efficiency for the RF power delivered to the RF power processor; and a control system, the control system being capable of adjusting at least one of:
  a) frequency of the RF power delivered to the RF power processor from the RF power amplifier; and
  b) impedance seen by the RF power amplifier by adjusting the RF match;
in response to the RF power delivery efficiency derived by the sensor so as to achieve delivery of the RF power to the RF power processor.

3. The apparatus of claim 2 wherein means for adjusting the frequency of the RF power so as to maintain the input current and input voltage within the capabilities of the electric power source comprises means for deriving a power form signal for the input electric power; and wherein the control system is capable of adjusting the frequency of the delivered RF power in response to the power form signal of the input electric power.

4. The apparatus of claim 3 wherein the means for deriving a power form signal comprises the sensor.

5. The apparatus of claim 1 wherein the means for adjusting the frequency of the RF power so as to maintain the input current and input voltage within the capabilities of the electric power source comprises:

means for deriving a power form signal for the input electric power; and a control system, the control system being capable of adjusting the frequency of the delivered RF power in response to the power form signal of the input electric power.

6. The apparatus of claim 1 wherein the means for delivering RF power to the RF power processor comprises:

an RF power coupling element for delivering RF power to the RF power processor;

an RF match connected with the RF power coupling element for matching the RF power to the RF power processor;

a variable frequency RF power amplifier connected with the RF match, the RF amplifier being capable of providing an output RF power for delivery to the RF power processor;

a sensor for determining phase information for a characteristic of the RF power in the RF power coupling element, the sensor being capable of providing an output signal related to the phase information for the characteristic of the RF power in the RF power coupling element; and a control system responsive to the output signal from the sensor, the control system being arranged to adjust the frequency of a reference RF signal used by the RF power amplifier so as to maintain a constant phase angle between the characteristic of the RF power in the RF power coupling element and the reference RF signal used by the RF power amplifier.

7. The apparatus of claim 6 wherein the means for adjusting the frequency of the RF power so as to maintain the input current and input voltage within the capabilities of the electric power source comprises means for deriving a power form signal for the input electric power; and wherein the control system is capable of adjusting the frequency of the delivered RF power in response to the power form signal of the input electric power.

8. The apparatus of claim 7 wherein the means for deriving a power form signal comprises the sensor.

9. The apparatus of claim 6 further comprising:

a meter for measuring characteristics of power input to the RF power amplifier, the meter being capable of providing an output signal related to the measured characteristics of power input to the RF power amplifier; and wherein the control system is responsive to the output signal from the meter and a set point, the control system is arranged to control the gain of the RF power amplifier so as to allow delivery of a controlled magnitude of a characteristic of the RF power determined by the set point.

10. The apparatus of claim 9 wherein the means for adjusting the frequency of the RF power so as to maintain the input current and input voltage within the capabilities of the electric power source comprises means for deriving a power form signal for the input electric power; and wherein the control system is capable of adjusting the frequency of the delivered RF power in response to the power form signal of the input electric power.

11. The apparatus of claim 10 wherein the means for deriving a power form signal comprises the sensor.

12. The apparatus of claim 10 wherein the means for deriving a power form signal comprises the meter.

13. A method of operating a variable frequency RF power delivery system for delivering RF power to a load for a process operation, the RF power delivery system including a variable frequency RF power amplifier and an RF power coupling element, the RE power delivery system being capable of receiving electric power from a DC or slow AC power source and delivering RE power to the load, the method comprising the steps of:

adjusting at least one of:
  a) frequency of the delivered RF power; and
  b) impedance seen by the RF power source;
in response to the RF power delivery efficiency so as to achieve delivery of the RF power to the load; and adjusting the frequency of the delivered RF power in response to the power form for the electric power input to the RF power delivery system so as to maintain the input current and voltage within the capabilities of the available power source.

14. The method of claim 13 wherein the step of adjusting the frequency of the delivered RF power in response to the power form comprises at least one of the steps of:
  a) controlling the power form of the input electric power through minimizing RF voltage by adjusting the RF frequency;
  b) controlling the power form of the input electric power through minimizing input electric power voltage by adjusting the RF frequency;
  c) controlling the power form of the input electric power through maximizing input electric power current by adjusting the RF frequency; and
  d) controlling the power form of the input electric power through maximizing RF current by adjusting the RF frequency.

15. The method of claim 13 wherein the step of adjusting the frequency of the delivered RF power in response to the power form comprises controlling the power form of the input electric power through maximizing RF current by adjusting the RF frequency.

16. The method of claim 13 wherein adjusting the frequency of the delivered RF power comprises maintaining a constant phase angle between the phase of a reference RF signal used by the variable frequency RF power amplifier and a phase of a characteristic of the RF power in the RF power coupling element so as to effect efficient RF power delivery to the load.

17. The method of claim 16 further comprising the step of adjusting the gain of the RF power amplifier in response to a set point and measured characteristics of the electric power input to the RF power amplifier so as to maintain the electric power input at a level specified by the set point and allowing the amount of RF power output from the RF power amplifier to maintain a constant delivery of a magnitude of a characteristic of the RF power to the load as determined by the set point.

18. The method of claim 16 wherein the characteristic of the RF power in the RF power coupling element is an RF current.

19. The method of claim 16 wherein the characteristic of the RF power in the RF power coupling element is an RF voltage.

20. The method of claim 16 wherein the constant phase angle is a predetermined constant phase angle derived from pre-tuning.

21. The method of claim 16 wherein the load includes an ionizable gas and the method further comprising the step of generating a plasma.

22. The method of claim 16 further comprising the step of heating the load by RF power induction.

23. In combination,
   an RF power processor capable of receiving RF power for performing a process operation;
   an RF power coupling element, the RF power coupling element being capable of and disposed so as to couple RF power to the RF power processor;
   an RF match connected with the RF power coupling element;
   a variable frequency RF power amplifier connected with the RF match, the RF power amplifier being capable of receiving input electric power from an electric power source, the RF power amplifier being capable of applying RF power to the RF match;
   a sensor, the sensor being capable of deriving RF power delivery efficiency, the sensor being disposed so as to derive RF power delivery efficiency for the RF power delivered to the RF power processor;
   means for deriving a power form signal for the input electric power;
   a control system, the control system being capable of adjusting at least one of:
      a) frequency of the RF power delivered to the RF power processor from the RF power amplifier; and
      b) impedance seen by the RF power amplifier by adjusting the RF match;
   in response to the RF power delivery efficiency derived by the sensor so as to achieve delivery of the RF power to the RF power processor;
   the control system also being capable of adjusting the frequency of the delivered RF power in response to the power form signal for the electric power input to the RF power amplifier so as to maintain the input current and voltage within the capabilities of the electric power source.

24. The combination of claim 23 wherein the RF power processor includes a plasma chamber capable of receiving a gas for generating a plasma.

25. The combination of claim 23 wherein the RF power processor is capable of receiving a semiconductor wafer for plasma processing.

26. The combination of claim 23 wherein the RF power processor includes a vacuum plasma processing chamber capable of sustaining a non-thermal plasma for semiconductor device fabrication processes.

27. The combination of claim 23 wherein the RF power processor includes a vacuum plasma processing chamber capable of sustaining a non-thermal plasma for semiconductor device fabrication processes selected from the group consisting of etching, deposition, surface cleaning, doping, oxidation, drying, photoresist stripping, reaction chamber cleaning, and annealing.

28. The combination of claim 23 wherein the RF power processor includes a vacuum plasma processing chamber capable of sustaining a non-thermal plasma.

29. The combination of claim 23 wherein the RF power processor includes a vacuum plasma processing chamber capable of sustaining a non-thermal plasma for abating refractory compounds selected from the group consisting of perfluorocompounds, carbon fluorides, carbon tetrafluoride, nitrogen triflouride, and sulfur hexafluoride.

30. The combination of claim 23 wherein the RF power processor is capable of receiving the RF power to produce heat for an RF power induction heating process.

31. The combination of claim 23 wherein the RF power processor includes a plasma processing chamber for generating a thermal plasma.

* * * * *